(12) United States Patent
Nakano et al.

(10) Patent No.: US 6,501,338 B2
(45) Date of Patent: Dec. 31, 2002

(54) THREE-BAND SWITCHING OSCILLATOR SUITABLE FOR SIZE REDUCTION

(75) Inventors: Kazuhiro Nakano, Fukushima-ken (JP); Hiroki Noumi, Miyagi-ken (JP); Isao Hasegawa, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 37 days.

(21) Appl. No.: 09/870,816

(22) Filed: May 31, 2001

(65) Prior Publication Data

US 2001/0050596 A1 Dec. 13, 2001

(30) Foreign Application Priority Data

Jun. 1, 2000 (JP) ........................................ 2000-169077

(51) Int. Cl.[7] .............................. H03B 5/12; H03B 5/18
(52) U.S. Cl. ...................... 331/48; 331/96; 331/117 R; 331/117 D; 331/177 V; 331/179
(58) Field of Search ............................. 331/46, 48, 49, 331/96, 107 SL, 117 R, 117 FE, 117 D, 177 V, 179

(56) References Cited

U.S. PATENT DOCUMENTS 5,852,384 A * 12/1998 Sakakura et al. ............. 331/48

FOREIGN PATENT DOCUMENTS

| JP | 9-307354 | 11/1997 |
|---|---|---|
| JP | 2000-174555 | 6/2000 |

\* cited by examiner

*Primary Examiner*—David C. Mis
(74) *Attorney, Agent, or Firm*—Brinks Hofer Gilson & Lione

(57) ABSTRACT

In a three-band switching oscillator, a switching circuit is provided to switch the operating conditions of a first and second voltage-controlled oscillator and to switch an oscillation frequency band of the first voltage-controlled oscillator. The switching circuit switches a first switch in accordance with a switching voltage inputted to a first switching terminal and switches an oscillation frequency band in accordance with a switching voltage inputted to a second switching terminal. Only when a high-level switching voltage is inputted to the second switching terminal, the second switch is placed into an open condition by a high-level switching voltage inputted to the first switching terminal and placed into a closed condition by a low-level switching voltage inputted thereto, and when a low-level switching voltage is inputted to the second switching terminal, the second switch is placed into the open condition irrespective of the switching voltage inputted to the first switching terminal.

8 Claims, 6 Drawing Sheets

FIG. 2

| MODE | SW1 | SW2 | Q1 | Q2 | Q3 | VCO1 | VCO2 |
|------|-----|-----|-----|-----|-----|------|------|
| 1 | L | L | OFF | OFF | OFF | NO OPERATION | NO OPERATION |
| 2 | L | H | OFF | ON | ON | NO OPERATION | GSM |
| 3 | H | L | ON | OFF | OFF | DCS | NO OPERATION |
| 4 | H | H | ON | ON | OFF | PCS | NO OPERATION |

FIG. 4

| MODE | SW1 | SW2 | Q4 | Q5 | Q6 | VCO1 | VCO2 |
|------|-----|-----|-----|-----|-----|------|------|
| 1 | L | L | OFF | OFF | OFF | NO OPERATION | NO OPERATION |
| 2 | L | H | OFF | OFF | ON | NO OPERATION | GSM |
| 3 | H | L | ON | OFF | OFF | DCS | NO OPERATION |
| 4 | H | H | ON | ON | OFF | PCS | NO OPERATION |

FIG. 6
PRIOR ART

| MODE | SW1 | SW2 | SW3 | VCO1 | VCO2 |
|---|---|---|---|---|---|
| 1 | L | L | L | NO OPERATION | NO OPERATION |
| 2 | L | L | H | NO OPERATION | NO OPERATION |
| 3 | L | H | L | NO OPERATION | GSH |
| 4 | L | H | H | NO OPERATION | GSH |
| 5 | H | L | L | DCS | NO OPERATION |
| 6 | H | L | H | PCS | NO OPERATION |
| 7 | H | H | L | DCS | GSM |
| 8 | H | H | H | PCS | GSM |

THREE-BAND SWITCHING OSCILLATOR SUITABLE FOR SIZE REDUCTION

BACKGROUND OF THE INVENTION

1. Field of the Invention

The present invention relates to a three-band switching oscillator for use in portable telephones or the like, which is designed to output an oscillation signal in any one of three frequency bands.

2. Description of the Related Art

The recent oscillators have been designed to make oscillation in a plurality of frequency bands. FIG. 5 is an illustration of an arrangement of a conventional three-band switching oscillator handling three systems, for example, DCS (cellular telephone using 1800 MHz band), PCS (cellular telephone using 1900 MHz band) and GSM (cellular telephone using 900 MHz band). In addition, this takes four modes: output of an oscillation signal in any one of frequency bands and non-output of an oscillation signal in these frequency bands.

In FIG. 5, a first voltage-controlled oscillator 31 is composed of a first oscillation transistor 32 and a first resonance circuit 33 connected to the base thereof, and serves as a common collector type oscillator. The first resonance circuit 33 includes a first varactor diode 33a and resonant lines 33b and 33c connected in series to each other, while a switching diode 33d is connected in parallel with one resonant line 33c. The anode of the first varactor diode 33a is grounded while the cathode thereof is connected to a control terminal 34. Moreover, the cathode of the switching diode 33d is in a grounded condition.

An oscillation signal is outputted from the emitter of the first oscillation transistor 32 and is inputted to the base of a first amplification transistor 35a constituting a first amplifier 35. In addition, the oscillation signal amplified is outputted from the collector of the first amplification transistor 35a.

The first amplification transistor 35a and the first oscillation transistor 32 are connected in series with respect to a power supply, and a power supply voltage Vb is applied to the collector of the first amplification transistor 35a, while a voltage is applied through the emitter thereof to the collector of the first oscillation transistor 32. In addition, resistors 36, 37 and 38 for setting a bias voltage are connected to the base of the first amplification transistor 35a and the base of the first oscillation transistor 32, and the resistor 36 is connected to the emitter of the first switching transistor 39. The power supply voltage Vb is given to the collector of the first switching transistor 39, while the base thereof is connected to as first switching terminal 40. The anode of the switching diode 33d is connected to a second switching terminal 41.

Meanwhile, a second voltage-controlled oscillator 51 is composed of a second oscillation transistor 52 and a second resonance circuit 53 connected to the base thereof, and acts as a common collector type oscillator. The second resonance circuit 53 includes a second varactor diode 53a, a resonant line 53b, and other elements. The anode of the second varactor diode 53a is grounded, while the cathode thereof is connected to the control terminal 34.

An oscillation signal is outputted from the second oscillation transistor 52 and is inputted to the base of a second amplification transistor 54a constituting a second amplifier 54. In addition, the oscillation signal amplified is outputted from the collector of the second amplification transistor 54a.

The second amplification transistor 54a and the second oscillation transistor 52 are connected in series with respect to the power supply, and the power supply voltage Vb is applied to the collector of the second amplification transistor 54a, while a voltage is supplied through the emitter thereof to the collector of the second oscillation transistor 52. In addition, resistors 55, 56 and 57 for setting a bias voltage are connected to the base of the second amplification transistor 54a and the base of the second oscillation transistor 52, and the resistor 55 is connected to the emitter of a second switching transistor 58. The power supply voltage Vb is given to the collector of the second switching transistor 58, and the base thereof is connected to a third switching terminal 59.

In the above-mentioned arrangement, a high-level or low-level switching voltage coming from the body side of the portable telephone is applied to the first switching terminal 40, the second switching terminal 41 and the third switching terminal 59. Referring to FIG. 6, a description will be given of an operation of each of the voltage-controlled oscillators 31 and 51 based on;this switching voltage. In the description which will be given with reference to FIG. 6, the first to third switching terminals 40, 41 and 59 are taken as SW1, SW2 and SW3, respectively, while the high-level and low-level switching voltages are taken as (H) and (L), respectively. In addition, the first voltage-controlled oscillator 31 is taken as VCO1 and the second voltage-controlled oscillator 51 is taken as VCO2.

First, when the SW1 is at (L), the first switching transistor 39 turns off to stop the bias voltage supply to the base of the first oscillation transistor 32, thereby making the first voltage-controlled oscillator 31 inoperative. Contrary to this, when the SW1 is at (H), it becomes operative. In addition, when the SW2 is at (L) in the operative condition, the switching diode 33d turns off, and the VCO1 oscillates in a first frequency band which is low in frequency. This frequency band is for use in the DCS system. On the other hand, when the SW2 is at (H), the switching diode 33d turns on, so the VCO1 oscillates in a second frequency band which is high in frequency. This frequency band is for use in the PCS system.

In like manner, when the SW3 is at (L), the second switching transistor 58 turns off to stop the bias voltage supply to the base of the second oscillation transistor 52, so the second voltage-controlled oscillator 51 becomes inoperative. Contrary to this, when the SW2 is at (H), it becomes in an actuated condition, and the oscillation takes place in a third frequency band. This frequency band is available for the GSM system.

That is, in the above-described operation, a high-level or low-level switching voltage is inputted to the first to third switching terminals 40, 41 and 59, and eight switching modes are attainable according to combinations thereof. FIG. 6 shows these switching modes, and of these, the modes No. 1 and No. 2 are the same operational contents and the modes No. 3 and No. 4 are the same operational contents, so only one modes are put to use. In addition, since the first voltage-controlled oscillator 31 and the second voltage-controlled oscillator 51 are not put to use at the same time, the modes No. 7 and No. 8 are not employable.

In the above-described conventional three-band switching oscillator, the three switching terminals (40, 41, 59) are used in order to obtain four necessary switching modes. The most important point to an oscillator for use in a portable telephone is size reduction, and hence, various improvements have been made in order to realize the size reduction. An decrease in number of terminals contributes greatly to the size reduction; however, an approach to decrease the number of terminals has not been made until now.

Furthermore, in the conventional three-band switching oscillator, since the binary switching voltages are applied to the three switching terminals, unnecessary switching modes come about. This complicates the circuit on the body side of a portable telephone which generates the switching voltages.

SUMMARY OF THE INVENTION

Accordingly, it is an object of the present invention to provide a three-band switching oscillator capable of decreasing the number of switching terminals for achieving the size reduction and of simplifying the arrangement of the body side of a portable telephone which generates switching voltages.

For achieving this purpose, in accordance with the present invention, there is provided a three-band switching oscillator comprising a first voltage-controlled oscillator switched to make oscillation in a first or second frequency band, a second voltage-controlled oscillator made to make oscillation in a third frequency band, and a switching circuit for switching the first and second voltage-controlled oscillators to an operative condition or an inoperative condition and further for switching an oscillation frequency band of the first voltage-controlled oscillator, the switching circuit including first switch means for supplying a current to place the first voltage-controlled oscillator into the operative condition, second switch means for supplying a current to place the second voltage-controlled oscillator into the operative condition, and first and second switching terminals for receiving switching voltages, wherein the first switch means is placed into an open or closed condition in accordance with a low-level or high-level switching voltage inputted to the first switching terminal and the oscillation frequency band is switched in accordance with a high-level or low-level switching voltage inputted to the second switching terminal, while only when the high-level switching voltage is inputted to the second switching terminal, the second switch means is placed into an open condition by the high-level switching voltage inputted to the first switching terminal and placed into a closed condition by the low-level switching voltage inputted thereto, and when the low-level switching voltage is inputted to the second switching terminal, the second switch means is placed into the open condition irrespective of the switching voltage inputted to the first switching terminal.

In addition, a first oscillation transistor is provided in the aforesaid first voltage-controlled oscillator and a second oscillation transistor is provided in the second voltage-controlled oscillator, while the first switch means is placed in series to a first resistor circuit for applying a bias voltage to the base of the first oscillation transistor, and the second switch means is placed in series to a second resistor circuit for applying a bias voltage to the base of the second oscillation transistor.

Still additionally, the first switch means is constructed with a first NPN transistor whose collector is connected to a power supply voltage applying terminal and whose emitter is connected to the first resistor circuit, while the second switch means is constructed with a second NPN transistor whose collector is connected to the power supply voltage applying terminal and a first PNP transistor whose emitter is connected to the emitter of the second NPN transistor and whose collector is connected to the second resistor circuit, with the bases of the first NPN transistor and the first PNP transistor being connected to the first switching terminal and the base of the second NPN transistor being connected to the second switching terminal.

Moreover, the first voltage-controlled oscillator includes a resonant line and a switching diode connected in parallel with the resonant line, with the cathode of the switching diode being grounded and the anode thereof being connected to the emitter of the second NPN transistor.

Still moreover, a first oscillation transistor is provided in the first voltage-controlled oscillator and a second oscillation transistor is provided in the second voltage-controlled oscillator, while the first switch means is interposed between the emitter of the first oscillation transistor and the ground and the second switch means is placed in series to a second resistor circuit for applying a bias voltage to the base of the second oscillation transistor.

In addition, the first switch means is constructed with a third NPN transistor whose collector is connected to the emitter side of the first oscillation transistor and whose emitter is connected to the ground side, and the second switch means is constructed with second and third PNP transistors whose emitters are connected to a power supply voltage applying terminal, with the collector of the third PNP transistor being connected to the second resistor circuit and the base of the third NPN transistor being connected to the first switching terminal, while the collector of the second PNP transistor and the base of the third PNP transistor being connected to each other and connected through a resistor to the first switching terminal and the base of the second PNP transistor being connected to the second switching terminal.

Still additionally, the first voltage-controlled oscillator includes a resonant line and a switching diode connected in parallel with the resonant line, with the cathode of the switching diode being grounded and the anode thereof being connected to the second switching terminal.

Moreover, the difference in center frequency between the first frequency band and the second frequency band is set to be smaller than the difference in center frequency between the first frequency band and the third frequency band and the difference in center frequency between the second frequency band and the third frequency band.

BRIEF DESCRIPTION OF THE DRAWINGS

FIG. 2 is an illustration of an operative condition in an operation of the three-band switching oscillator according to the first embodiment of the present invention;

FIG. 4 is an illustration of an operative condition in an operation of the three-band switching oscillator according to the second embodiment of the present invention;

FIG. 6 is an illustration of an operative condition in an operation of the conventional three-band switching oscillator.

DESCRIPTION OF THE PREFERRED EMBODIMENTS

Figure 1:
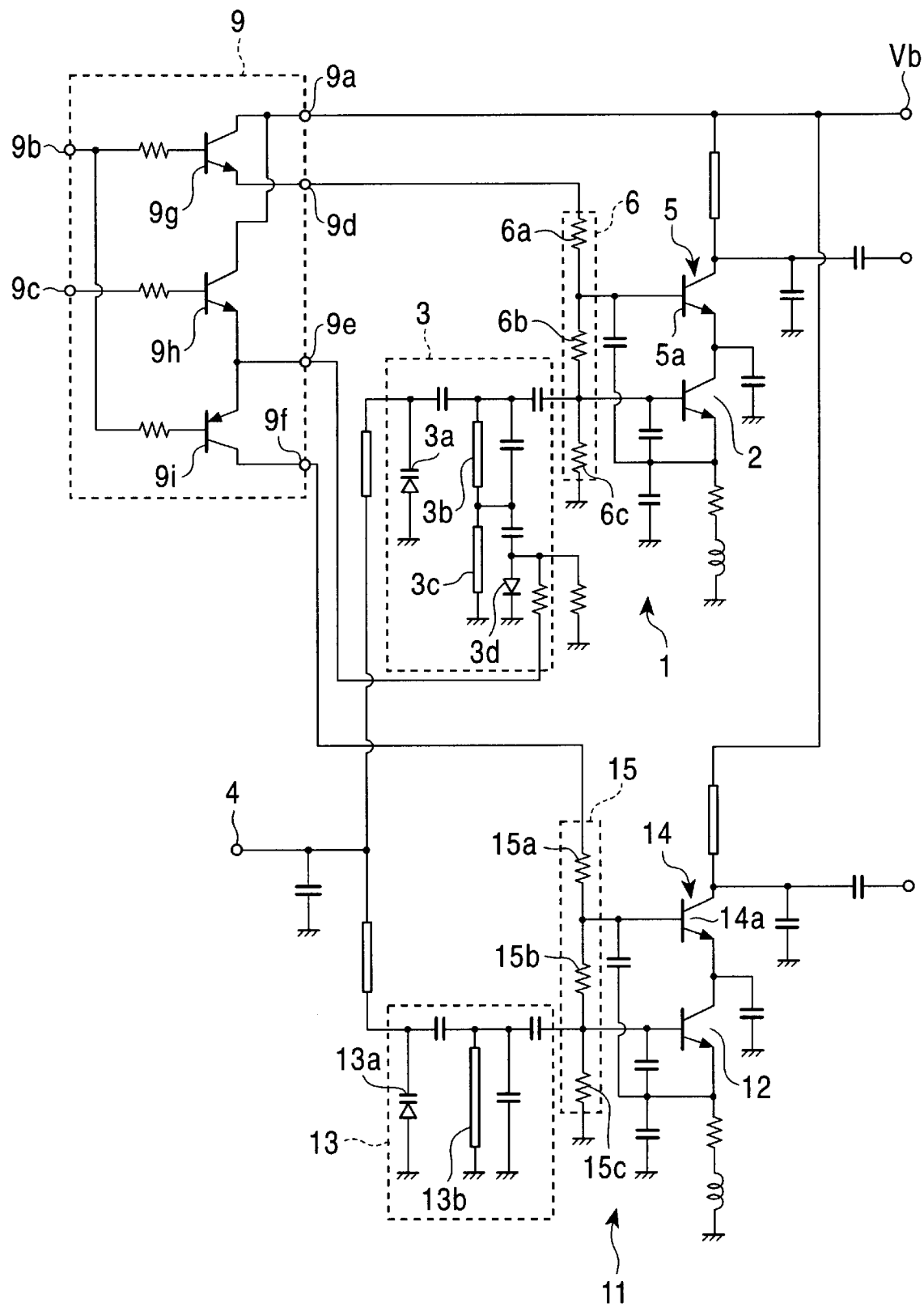
FIG. 1 is a circuit diagram showing an arrangement of a three-band switching oscillator according to a first embodiment of the present invention.

First of all, referring to FIGS. 1 and 2, a description will be given hereinbelow of a three-band switching oscillator according to a first embodiment of the present invention. In FIG. 1, a first voltage-controlled oscillator 1 is composed of a first oscillation transistor 2 and a first-resonance circuit 3 connected to the base thereof, and serves as a common collector type oscillator. The first resonance circuit 3 includes a first varactor diode 3a and first and second resonant lines 3b and 3c connected in series to each other, and the second resonant line 3c is connected in parallel with a switching diode 3d grounded at its cathode. The anode of the first varactor diode 3a is grounded and the cathode thereof is connected to a control terminal 4. In addition, the oscillation frequency of the first voltage-controlled oscillator 1 is made to vary by varying a control voltage to be applied to the control terminal 4.

The first voltage controlled oscillator 1 oscillates in a first frequency band, which is low in frequency, when the switching diode 3d is in an off condition, and oscillates in a second frequency band, which is high in frequency, when being in an on condition. The first frequency band is available for the DCS (cellular telephone using 1800 MHz band) system, while the second frequency band is for the PCS (cellular telephone using 1900 MHz band) system. An oscillation signal is outputted from the emitter of the first oscillation transistor 2 and is inputted to the base of a first amplification transistor 5a constituting a first amplifier 5. In addition, the amplified oscillation signal is outputted from the collector of the first amplification transistor 5a.

The first amplification transistor 5a and the first oscillation transistor 2 are connected in series to each other, and a power supply voltage Vb is applied from a power supply voltage applying terminal 7 to the collector of the first amplification transistor 5a, and a voltage is applied from the emitter thereof to the collector of the first oscillation transistor 2. In addition, a first resistor circuit 6 for supplying a bias voltage is connected to the base of the first amplification transistor 5a and the base of the first oscillation transistor 2. The first resistor circuit 6 is constructed in a manner that resistors 6a, 6b and 6c are connected in series to each other, and the resistor 6c is connected between the base of the first oscillation transistor 2 and the ground, while the resistor 6b is connected between the base of the first oscillation transistor 2 and the base of the first amplification transistor 5a. Still additionally, a voltage is applied from a switching circuit 9 to the anode of the switching diode 3d in the first resonance circuit 3 and the resistor 6a.

On the other hand, the second voltage-controlled oscillator 11 is composed of a second oscillation transistor 12 and a second resonance circuit 13 connected to the base thereof, and acts as a common collector oscillator. The second resonance circuit 13 includes a second varactor diode 13a, a third resonant line 13b, and other devices.

The oscillation frequency of the second voltage-controlled oscillator 11 is made to vary in accordance with a control voltage to be applied to the control terminal 4. In addition, it makes oscillation in a third frequency band, and this frequency band is employable for the GSM (cellular telephone using 900 MHz band). The frequency thereof is lower than those of the first and second frequency bands for the first voltage-controlled oscillator 1. An oscillation signal is outputted from the emitter of the second oscillation transistor 12 and is inputted to the base of a second amplification transistor 14a organizing a second amplifier 14. The amplified oscillation signal is outputted from the collector of the second amplification transistor 14a.

The second amplification transistor 14a and the second oscillation transistor 12 are connected in series to each other, and the power supply voltage Vb is supplied to the collector of the second amplification transistor 14a, while a voltage is supplied from the emitter thereof to the collector of the second oscillation transistor 12. In addition, a second resistor circuit 15 for supplying a bias voltage is connected to the base of the second amplification transistor 14a and the base of the second oscillation transistor 12. The second resistor circuit 15 is constructed in a manner that resistors 15a, 15b and 15c are connected in series to each other. Still additionally, the resistor 15c is connected between the base of the second oscillation transistor 12 and the ground, while the resistor 15b is connected between the base of the second oscillation transistor 12 and the base of the second amplification transistor 14a. A voltage is applied from the switching circuit 9 to the resistor 15a.

The switching circuit 9 is made up of a voltage input terminal 9a for receiving the power supply voltage Vb, first and second switching terminals 9b and 9c for receiving a binary voltage of a high-level or low-level voltage, a first output terminal 9d for outputting a voltage to place the first voltage-controlled oscillator 1 and the first amplifier 5 into an operative condition, a second output terminal 9e for outputting a voltage to switch the oscillation frequency band of the first voltage-controlled oscillator 1, and a third output terminal 9f for outputting a voltage to set the second voltage-controlled oscillator 11 and the second amplifier 14 to an operative condition. In addition, it includes a first NPN transistor 9g, a second NPN transistor 9h and a first PNP transistor 9i.

Still additionally, the first output terminal 9d is connected to the resistor 6a of the first resistor circuit 6, the second output terminal 9e is connected to the anode of the switching diode 3d, and the third output terminal 9f is connected to the resistor 15a of the second resistor circuit 15.

The NPN transistor 9g, serving as a first switch means, is interposed between the voltage input terminal 9a and the first output terminal 9d, and the collector thereof is connected to the voltage input terminal 9a, while the emitter thereof is connected to the first output terminal 9d.

Moreover, the second NPN transistor 9h and the first PNP transistor 9i are interposed between the voltage input terminal 9a and the third output terminal 9f. Still moreover, the second NPN transistor 9h and the first PNP transistor 9i constitute a second switch means. The collector of the second NPN transistor 9h is connected to the voltage input terminal 9a, and the emitter thereof is connected to the emitter of the first PNP transistor 9i and the second output terminal 9e. The collector of the first PNP transistor 9i is connected to the third output terminal 9f.

An operation of the above-described arrangement is as follows. The first NPN transistor 9g turns on/off in response to a high-level/low-level switching voltage inputted to the first switching terminal 9b. The second NPN transistor 9h turns on/off in response to a high-level/low-level switching voltage inputted to the second switching terminal 9c. In addition, the first PNP transistor 9i turns on/off in accordance with a low-level/high-level switching voltage inputted to the first switching terminal 9b in a state where a high-level switching voltage is inputted to the second switching terminal 9c. Since the second NPN transistor 9h is in an off condition with a low-level switching voltage being inputted to the second switching terminal 9c, even if a low-level switching voltage is inputted to the first switching terminal 9b, the first PNP transistor 9i is in an off condition. Accordingly, when at least one of the second NPN transistor 9h and the first PNP transistor 9i is in the off condition, no voltage develops at the third output terminal 9f.

Furthermore, when the first NPN transistor 9g is in the off condition, since the current, which produces a bias voltage for activating the first oscillation transistor 2, does not flow through the first resistor circuit 6, the first voltage-controlled oscillator 1 falls into an inoperative condition.

Likewise, if at least one of the second NPN transistor 9h and the first PNP transistor 9i is in the off condition, since the current, which produces a bias voltage for activating the second oscillation transistor 12, does not flow through the second resistor circuit 15, the second voltage-controlled oscillator 11 becomes inoperative.

That is, the above-described operation becomes as shown in FIG. 2. In FIG. 2, SW1 and SW2 represent the first switching terminal 9b and the second switching terminal 9c, respectively, and in the columns of the SW1 and SW2, (H) depicts a high-level voltage while (L) denotes a low-level voltage.

Moreover, Q1, Q2 and Q3 designate the first NPN transistor 9g, the second NPN transistor 9h and the first PNP transistor 9i, respectively, and (ON) and (OFF) signify the turning-on (closed condition) and the turning-off (open condition), respectively.

Still moreover, VCO1 and VCO2 represent the first voltage-controlled oscillator 1 and the second voltage-controlled oscillator 11, respectively, while in the columns of the VCO1 and VCO2, (DCS) depicts that the first voltage-controlled oscillator 1 oscillates in the first frequency band, (PCS) denotes that it oscillates in the second frequency band, and (GSM) designates that the second oscillator 11 oscillates in the third frequency band.

First, in the first switching mode (No. 1), when both SW1 and SW2 are at (L), each of Q1 to Q3 becomes (OFF). Accordingly, both VCO1 and VCO2 fall into an inoperative condition.

On the other hand, in the second switching mode (No. 2), when SW1 is at (L) and SW2 is set at (H), Q1 becomes (OFF) while Q2 and Q3 become (ON). Accordingly, VCO1 becomes inoperative while VCO2 becomes operative.

Furthermore, in the third switching mode (No. 3), when SW1 is at (H) and SW2 is at (L), Q1 becomes (ON) while Q2 and Q3 become (OFF), so VCO1 becomes operative. The oscillation takes place in the first frequency band. On the other hand, VCO2 becomes inoperative.

Lastly, in the fourth switching mode (No. 4), when both SW1 and SW2 are at (H), Q1 and Q2 become (ON) while Q3 becomes (OFF). Accordingly, VCO1 makes oscillation in the second frequency band, and VCO2 becomes inoperative.

As described above, according to the present invention, four switching modes are established in accordance with switching voltage to be inputted to the two switching terminals 9b and 9c, that is, no oscillation takes place in any frequency band, whereas oscillation takes place in each of three frequency bands.

Figure 3:
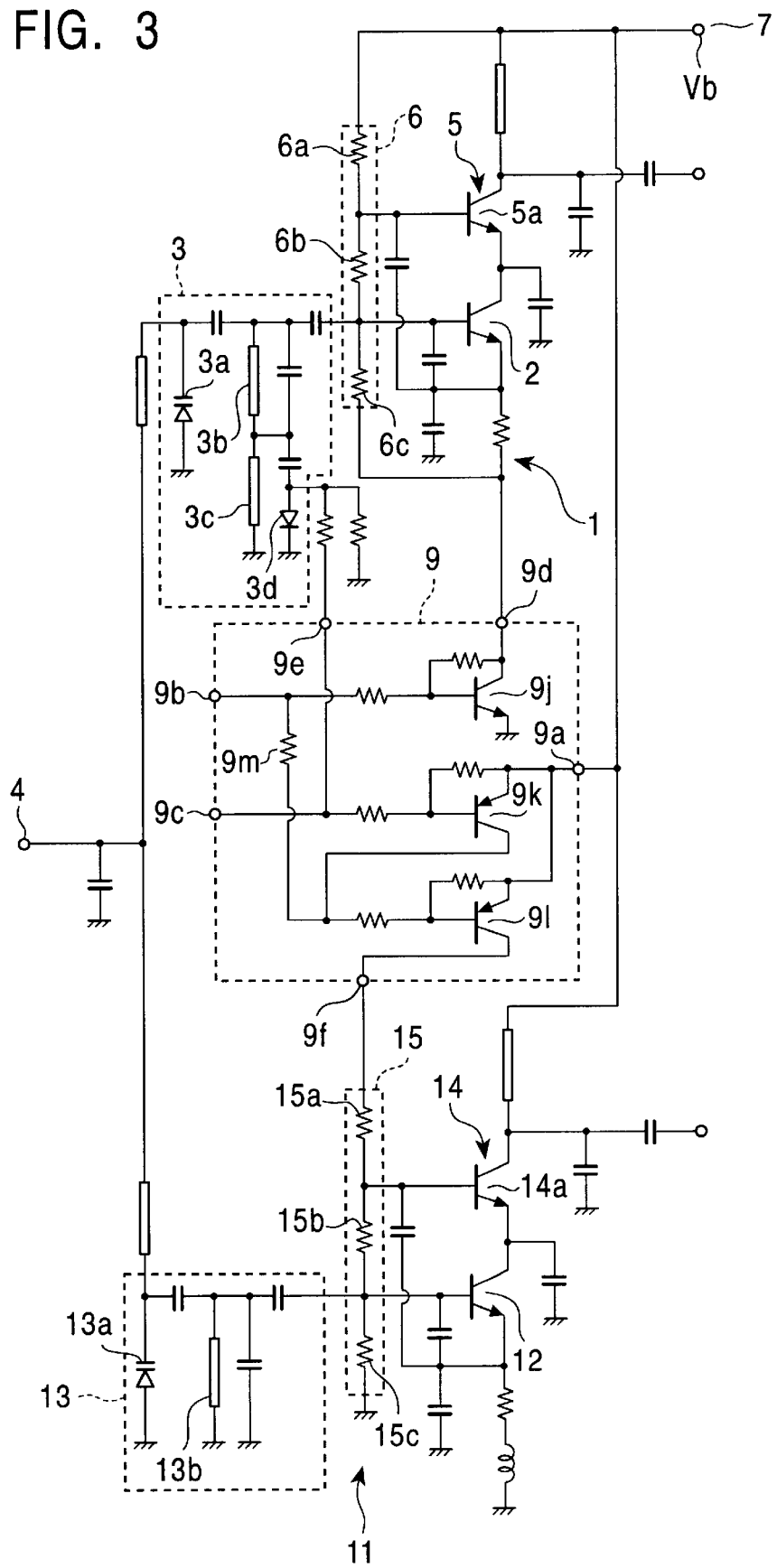
FIG. 3 is a circuit diagram showing an arrangement of a three-band switching oscillator according to a second embodiment of the present invention.
Figure 5:
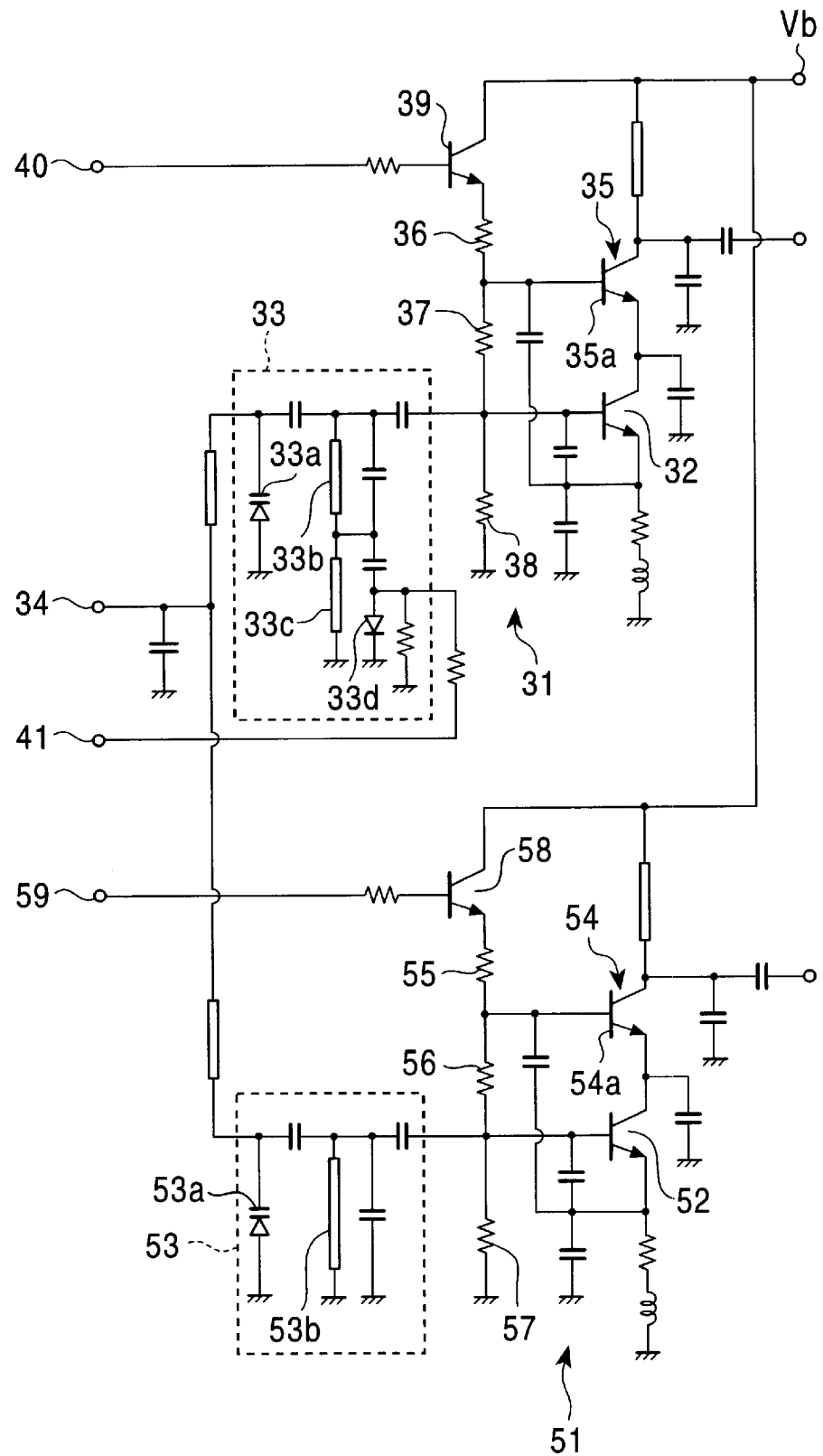
FIG. 5 is an circuit diagram showing an arrangement of a conventional three-band switching oscillator.

FIGS. 3 and 4 are illustrations of a three-band switching oscillator according to a second embodiment of the present invention, where a modification is made with respect to the arrangement of the switching circuit 9.

As FIG. 3 shows, the resistor 6a of the first resistor circuit 6 is connected between the power supply voltage applying terminal 7 and the base of the first amplification transistor 5a, and a resistor 6c is connected between the base and emitter of the first oscillation transistor 2. In addition, the switching circuit 9 includes a third NPN transistor 9j, a second PNP transistor 9k and a third PNP transistor 9l.

The power supply voltage Vb is inputted to a voltage input terminal 9a of the switching circuit 9, and the first output terminal 9d is connected to the emitter of the first oscillation transistor 2 and the resistor 6c of the first resistor circuit 6. In addition, the second output terminal 9e is connected to the anode of the switching diode 3d while the third output terminal 9f is connected to the resistor 15a of the second resistor circuit 15.

The third NPN transistor 9j, acting as a first switch means, is interposed between the first output terminal 9d and the ground, with the collector thereof being connected to the first output terminal 9d and the emitter thereof being connected to the ground.

In addition, the second PNP transistor 9k and the third PNP transistor 9l are interposed between the voltage input terminal 9a and the third output terminal 9f. Still additionally, the second PNP transistor 9k and the third PNP transistor 9l constitute a second switch means.

Furthermore, the emitters of the second PNP transistor 9k and the third PNP transistor 9l are connected to the voltage input terminal 9a, and the collector of the third PNP transistor 9l is connected to the third output terminal 9f, and further the collector of the second PNP transistor 9k is connected to the base of the third PNP transistor 9l.

Still furthermore, the base of the third NPN transistor 9j is connected to the first switching terminal 9b, and the base of the second PNP transistor 9k is connected to the second switching terminal 9c, and further, the second output terminal 9e and the second switching terminal 9c are connected to each other. Moreover, the collector of the second PNP transistor 9k and the base of the third PNP transistor 9l are connected through a resistor 9m to the first,switching terminal 9b.

An operation of the arrangement shown in FIG. 3 is as follows. The third NPN transistor 9j turns on/off in response to a high-level/low-level switching voltage inputted to the first switching terminal 9b. The second PNP transistor 9k turns on/off in response to a high-level/low-level switching voltage inputted to the second switching terminal 9c. Furthermore, the third PNP transistor 9l turns on/off in response to a low-level/high-level switching voltage inputted to the first switching terminal 9b in a state where a high-level switching voltage is inputted to the second switching terminal 9c (accordingly, when the second PNP transistor 9k is in an off condition). Since the second PNP transistor 9k takes an on condition in a state where a low-level switching voltage is on the second switching terminal 9c, even if a low-level switching voltage is inputted to the first switching terminal 9b, the third PNP transistor 9l does not fall into the on condition. Accordingly, no voltage appears at the third output terminal 9f if the second PNP transistor 9k is in the on condition or if the third PNP transistor 9l is in the off condition.

In addition, when the third NPN transistor 9j is in the off condition, a current for activating the first oscillation transistor 2 does not flow through not only the first resistor circuit 6, but also the collector and emitter of the first oscillation transistor 2, the first voltage-controlled oscillator 1 falls into the inoperative condition.

Likewise, if at least the second PNP.transistor 9k is in the on condition or if at least the third PNP transistor 9l is in the off condition, since a current for producing a bias voltage to place the second oscillation transistor 12 into an operative condition does not flow through the second resistor circuit 15, the second voltage-controlled oscillator 11 falls into an inoperative condition.

That is, the above-described operation is as shown in FIG. 4. In FIG. 4, Q4, Q5 and Q6 represent the third NPN transistor 9j, the second PNP transistor 9k and the third PNP transistor 9l, respectively, and other symbols are identical to those in FIG. 2.

First, in the first switching mode (No. 1), if both SW1 and SW2 are at (L), each of Q4 to Q6 becomes (OFF). Accordingly, both VCO1 and VCO2 become inoperative.

Furthermore, in the second switching mode (No. 2), if SW1 is at (L) and SW2 is at (H), Q4 and Q5 become (OFF) while Q6 becomes (ON). Accordingly, VCO1 becomes inoperative while VCO2 becomes operative.

Still furthermore, in the third switching mode (No. 3), if SW1 is at (H) and SW2 is at (L), Q4 and Q5 become (ON) while Q6 becomes (OFF), so VCO1 becomes operative, and the oscillation takes place in the first frequency band. At this time, VCO2 becomes inoperative.

Lastly, in the fourth switching mode (No. 4), if both SW1 and SW2 are at (H), Q4 falls into the (ON) condition while Q5 and Q6 fall into the (OFF) condition. Accordingly, VCO1 oscillates in the second frequency band while VCO2 falls into the inoperative condition.

As described above, also in the second embodiment, four switching modes are established in accordance with switching voltages to be inputted to the two switching terminals 9a and 9c, that is, no oscillation takes place in any frequency band and oscillation occurs in any one of three frequency bands.

With the three-band switching oscillator according to the present invention described above, since the first frequency band and the second frequency band approach each other (for example, the difference in center frequency is approximately 130 MHz) while these frequency bands and the third frequency band separate in frequency from each other (for example, the difference in center frequency is approximately 900 MHz), stable oscillating action is attainable by allocating the oscillations in the first frequency band and the second frequency band to the first voltage-controlled oscillator 1.

As described above, according to the present invention, the first and second voltage-controlled oscillators are switched to an operative condition or an inoperative condition, and the switching circuit is provided for switching the oscillation frequency band on the first voltage-controlled oscillator, where the switching circuit includes the first switch means, the second switch means and the first and second switching terminals to which a switching voltage is inputted, and the first switch means is placed into an open or closed condition in accordance with a low-level or high-level switching voltage and the oscillation frequency band is switched in accordance with a high-level or low-level switching voltage inputted to the second switching terminal, while only when a high-level switching voltage is inputted to the second switching terminal, the second switch means is placed into the open condition in response to the high-level switching voltage inputted to the first switching terminal and is placed into the closed condition by a low-level switching voltage inputted thereto, whereas in a state where a low-level switching voltage is inputted to the second switching terminal, the second switch means is placed into the open condition irrespective of the switching voltage inputted to the first switching terminal; therefore, four switching modes are establishable in accordance with the switching voltages to be inputted to the two switching terminals, thus enabling no oscillation in any frequency band and oscillation in any one of the three frequency bands.

In addition, the first oscillation transistor is provided in the first voltage-controlled oscillator and the second oscillation transistor is provided in the second voltage-controlled oscillator, and the first switch means is placed in series to the first resistor circuit for supplying a bias voltage to the base of the first oscillation transistor while the second switch means is placed in series to the second resistor circuit for supplying a bias voltage to the base of the second oscillation transistor; therefore, it is possible to easily switch the first and second voltage-controlled oscillators into.the operative condition or the inoperative condition.

Still additionally, the first switch means is constructed with a first NPN transistor whose collector is connected to a power supply voltage applying terminal and whose emitter is connected to the first resistor circuit, while the second switch means is constructed with a second NPN transistor whose collector is connected to the power supply voltage applying terminal and a first PNP transistor whose emitter is connected to the emitter of the second NPN transistor and whose collector is connected to the second resistor circuit, with the bases of the first NPN transistor and the first PNP transistor being connected to the first switching terminal and the base of the second NPN transistor being connected to the second switching terminal; therefore, the first voltage-controlled oscillator is switched into the operative condition or the inoperative condition by means of the first NPN transistor while the second voltage-controlled oscillator is switched into the operative condition or the inoperative condition by the second NPN transistor and the first PNP transistor.

Moreover, the first voltage-controlled oscillator includes a resonant line and a switching diode connected in parallel with the resonant line, with the cathode of the switching diode being grounded and the anode thereof being connected to the emitter of the second NPN transistor; therefore, the oscillation frequency band of the first voltage-controlled oscillator is switched by the second NPN transistor.

Still moreover, a first oscillation transistor is provided in the first voltage-controlled oscillator and a second oscillation transistor is provided in the second voltage-controlled oscillator, while the first switch means is interposed between the emitter of the first oscillation transistor and the ground and the second switch means is placed in series to a second resistor circuit for applying a bias voltage to the base of the second oscillation transistor; therefore, it is possible to easily switch the first and second voltage-controlled oscillators into the operative condition or the inoperative condition.

In addition, the first switch means is constructed with a third NPN transistor whose collector is connected to the emitter side of the first oscillation transistor and whose emitter is connected to the ground side, and the second switch means is constructed with second and third PNP transistors whose emitters are connected to a power supply voltage applying terminal, with the collector of the third PNP transistor being connected to the second resistor circuit and the base of the third NPN transistor being connected to the first switching terminal, while the collector of the second PNP transistor and the base of the third PNP transistor being connected to each other and connected through a resistor to the first switching terminal and the base of the second PNP transistor being connected to the second switching terminal; therefore, the first voltage-controlled oscillator is switched into the operative condition or the inoperative condition by means of the third NPN transistor while the second voltage-controlled oscillator is switched into the operative condition or the inoperative condition by the second PNP transistor and the third PNP transistor.

Still additionally, the first voltage-controlled oscillator includes a resonant line and a switching diode connected in parallel with the resonant line, with the cathode of the switching diode being grounded and the anode thereof being connected to the second switching terminal; therefore, the oscillation frequency band of the first voltage-controlled oscillator is directly switched by a switching voltage to be inputted to the second switching terminal.

Moreover, the difference in center frequency between the first frequency band and the second frequency band is set to be smaller than the difference in center frequency between the first frequency band and the third frequency band and the difference in center frequency between the second frequency band and the third frequency band; therefore, it is possible to stably make the first voltage-controlled oscillator oscillate in the first and second frequency bands.

What is claimed is:

1. A three-band switching oscillator comprising:
    a first voltage-controlled oscillator switched to oscillate in one of a first and second frequency band;
    a second voltage-controlled oscillator designed to oscillate in a third frequency band; and
    a switching circuit to switch said first and second voltage-controlled oscillators to one of an operative condition and an inoperative condition and to switch an oscillation frequency band of said first voltage-controlled oscillator,
    said switching circuit including:
        a first switch to supply a current to place said first voltage-controlled oscillator into the operative condition;
        a second switch to supply a current to place said second voltage-controlled oscillator into the operative condition; and
        first and second switching terminals to receive switching voltages,
        wherein said first switch is placed into one of an open and closed condition in accordance with one of a first low-level and first high-level switching voltage, respectively, inputted to said first switching terminal and the oscillation frequency band is switched in accordance with one of a second high-level and second low-level switching voltage inputted to said second switching terminal, while only when the second high-level switching voltage is inputted to said second switching terminal, said second switch is placed into an open condition by the first high-level switching voltage inputted to said first switching terminal and placed into a closed condition by the first low-level switching voltage inputted thereto, and when the second low-level switching voltage is inputted to said second switching terminal, said second switch is placed into the open condition irrespective of the switching voltage inputted to said first switching terminal.

2. A three-band switching oscillator according to claim 1, wherein a first oscillation transistor is provided in said first voltage-controlled oscillator and a second oscillation transistor is provided in said second voltage-controlled oscillator, while said first switch is placed in series with a first resistor circuit to apply a first bias voltage to a base of said first oscillation transistor and said second switch is placed in series to a second resistor circuit to apply a second bias voltage to a base of said second oscillation transistor.

3. A three-band switching oscillator according to claim 2, wherein said first switch comprises a first NPN transistor whose collector is connected to a power supply voltage applying terminal and whose emitter is connected to said first resistor circuit, while said second switch comprises a second NPN transistor whose collector is connected to said power supply voltage applying terminal and a first PNP transistor whose emitter is connected to an emitter of said second NPN transistor and whose collector is connected to said second resistor circuit, with the bases of said first NPN transistor and said first PNP transistor being connected to said first switching terminal and the base of said second NPN transistor being connected to said second switching terminal.

4. A three-band switching oscillator according to claim 3, wherein said first voltage-controlled oscillator includes a resonant line and a switching diode connected in parallel with said resonant line, with a cathode of said switching diode being grounded and an anode thereof being connected to the emitter of said second NPN transistor.

5. A three-band switching oscillator according to claim 1, wherein a first oscillation transistor is provided in said first voltage-controlled oscillator and a second oscillation transistor is provided in said second voltage-controlled oscillator, while said first switch is interposed between an emitter of said first oscillation transistor and ground and said second switch is placed in series with a second resistor circuit to apply a bias voltage to a base of said second oscillation transistor.

6. A three-band switching oscillator according to claim 5, wherein said first switch comprises a third NPN transistor whose collector is connected to an emitter side of said first oscillation transistor and whose emitter is connected to a ground side, and said second switch comprises second and third PNP transistors whose emitters are connected to a power supply voltage applying terminal, with a collector of said third PNP transistor being connected to said second resistor circuit and a base of said third NPN transistor being connected to said first switching terminal, while a collector of said second PNP transistor and or the base of said third PNP transistor being connected to each other and connected through a resistor to said first switching terminal and a base of said second PNP transistor being connected to said second switching terminal.

7. A three-band switching oscillator according to claim 6, wherein said first voltage-controlled oscillator includes a resonant line and a switching diode connected in parallel with said resonant line, with a cathode of said switching diode being grounded and an anode thereof being connected to said second switching terminal.

8. A three-band switching oscillator according to claim 1, wherein a difference between a center frequency of said first frequency band and a center frequency of said second frequency band is set to be smaller than a difference between said center frequency of said first frequency band and a center frequency of said third frequency band and a difference between said center frequency of said second frequency band and said center frequency of said third frequency band.

* * * * *